US012342678B2

United States Patent
Su et al.

(10) Patent No.: US 12,342,678 B2
(45) Date of Patent: Jun. 24, 2025

(54) ARRAY SUBSTRATE, MANUFACTURING METHOD THEREOF AND DISPLAY DEVICE (71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Tongshang Su, Beijing (CN); Jun Cheng, Beijing (CN); Qinghe Wang, Beijing (CN); Yongchao Huang, Beijing (CN); Chao Wang, Beijing (CN); Zhiwen Luo, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 650 days.

(21) Appl. No.: 17/625,029

(22) PCT Filed: Apr. 8, 2021

(86) PCT No.: PCT/CN2021/085904
§ 371 (c)(1),
(2) Date: Jan. 5, 2022

(87) PCT Pub. No.: WO2021/218587
PCT Pub. Date: Nov. 4, 2021

(65) Prior Publication Data
US 2022/0293709 A1 Sep. 15, 2022

(30) Foreign Application Priority Data

Apr. 27, 2020 (CN) .......................... 202010342425.6

(51) Int. Cl.
H10K 59/12 (2023.01)
H10K 50/115 (2023.01)
(Continued)

(52) U.S. Cl.
CPC ........... H10K 59/12 (2023.02); H10K 50/824 (2023.02); H10K 59/126 (2023.02);
(Continued)

(58) Field of Classification Search
CPC ............... H10K 59/12; H10K 59/8723; H10K 59/80522; H10K 59/38
See application file for complete search history.

(56) References Cited

U.S. PATENT DOCUMENTS

2005/0212413 A1 9/2005 Matsuura et al.
2006/0017375 A1* 1/2006 Noguchi ............. H10K 50/828
313/506
(Continued)

FOREIGN PATENT DOCUMENTS

CN 101483188 A 7/2009
CN 101728418 A 6/2010
(Continued)

OTHER PUBLICATIONS

Second Office Action for CN202010342425.6 mailed Aug. 29, 2022 with translation, 19 pages.
(Continued)

Primary Examiner — Moazzam Hossain
(74) Attorney, Agent, or Firm — Myers Bigel, P.A.

(57) ABSTRACT

The present disclosure provides an array substrate, a manufacturing method thereof, and a display device including the array substrate. The array substrate includes a substrate, a first electrode on the substrate, a light-emitting layer on a side of the first electrode away from the substrate, a second electrode on a side of the light-emitting layer away from the
(Continued)

first electrode, and an auxiliary electrode on the side of the light-emitting layer away from the first electrode and electrically connected with the second electrode.

12 Claims, 5 Drawing Sheets

(51) Int. Cl.
    *H10K 50/824* (2023.01)
    *H10K 59/126* (2023.01)
    *H10K 59/80* (2023.01)
    *H10K 71/00* (2023.01)

(52) U.S. Cl.
    CPC ....... *H10K 59/80522* (2023.02); *H10K 71/00* (2023.02); *H10K 50/115* (2023.02); *H10K 59/1201* (2023.02); *H10K 59/8723* (2023.02)

(56) References Cited

U.S. PATENT DOCUMENTS

| | | | |
|---|---|---|---|
| 2008/0197778 A1* | 8/2008 | Kubota | H10K 59/131 315/73 |
| 2009/0179558 A1 | 7/2009 | Yotsuya | |
| 2010/0097295 A1 | 4/2010 | Kwak | |
| 2010/0102713 A1 | 4/2010 | Seo et al. | |
| 2012/0132948 A1* | 5/2012 | Nunotani | H01L 33/38 438/22 |
| 2016/0071914 A1 | 3/2016 | Lee et al. | |
| 2018/0190933 A1 | 7/2018 | Zhang et al. | |
| 2019/0067391 A1 | 2/2019 | Li et al. | |
| 2019/0173047 A1 | 6/2019 | Sun et al. | |
| 2020/0043995 A1 | 2/2020 | Xie et al. | |
| 2020/0058896 A1 | 2/2020 | Wang et al. | |
| 2020/0227670 A1* | 7/2020 | Huang | H10K 59/80522 |
| 2021/0050394 A1 | 2/2021 | Zhao et al. | |
| 2021/0193953 A1 | 6/2021 | Liu et al. | |
| 2021/0226155 A1* | 7/2021 | Li | H10K 50/824 |

FOREIGN PATENT DOCUMENTS

| | | |
|---|---|---|
| CN | 101728419 A | 6/2010 |
| CN | 105789479 A | 7/2016 |
| CN | 107342372 A | 11/2017 |
| CN | 107394052 A | 11/2017 |
| CN | 107482044 A | 12/2017 |
| CN | 107634012 A | 1/2018 |
| CN | 108231846 A | 6/2018 |
| CN | 108539043 A | 9/2018 |
| CN | 109065751 A | 12/2018 |
| CN | 109065753 A | 12/2018 |
| CN | 109148527 A | 1/2019 |
| CN | 109378403 A | 2/2019 |
| CN | 109461840 A | 3/2019 |
| CN | 109791942 A | 5/2019 |
| CN | 109923675 A | 6/2019 |
| CN | 110459580 A | 11/2019 |
| CN | 111509138 A | 8/2020 |
| JP | 2009164068 A | 7/2009 |
| JP | 2011154797 A | 8/2011 |
| KR | 20100064586 A | 6/2010 |
| KR | 20150069712 A | 6/2015 |

OTHER PUBLICATIONS

"First Office Action and English language translation", CN Application No. 202010342425.6, Mar. 3, 2022, 27 pp.

"International Search Report and Written Opinion of the International Searching Authority (with English language translation of ISR)", International Application No. PCT/CN2021/085904, May 27, 2021, 12 pp.

* cited by examiner

ARRAY SUBSTRATE, MANUFACTURING METHOD THEREOF AND DISPLAY DEVICE

RELATED APPLICATIONS

The present application is a 35 U.S.C. 371 national stage application of PCT International Application No. PCT/CN2021/085904, filed on Apr. 8, 2021, which claims the benefit of Chinese Patent Application No. 202010342425.6, filed on Apr. 27, 2020, the entire disclosures of which are incorporated herein by reference.

TECHNICAL FIELD

The present disclosure relates to the field of display technology, in particular to an array substrate, a manufacturing method thereof, and a display device including the array substrate.

BACKGROUND

A display device usually includes an anode, a cathode and a light-emitting layer between the anode and the cathode, and is applied in a variety of fields, such as the display field, the automobile field, the medical detection field, etc. According to the light output direction of the display device, the display device can be divided into the top emitting display device and the bottom emitting display device. Compared with bottom emitting display devices, top emitting display devices have the advantages of large aperture ratio and high resolution, so they are more and more favored by people.

SUMMARY

According to an aspect of the present disclosure, there is provided an array substrate comprising: a substrate; a first electrode on the substrate; a light-emitting layer on a side of the first electrode away from the substrate; a second electrode on a side of the light-emitting layer away from the first electrode; and an auxiliary electrode on the side of the light-emitting layer away from the first electrode and electrically connected with the second electrode.

In some embodiments, the auxiliary electrode is on a surface of the second electrode away from the light-emitting layer and in direct contact with the surface.

In some embodiments, the auxiliary electrode is between the second electrode and the light-emitting layer and is in direct contact with a surface of the second electrode close to the light-emitting layer.

In some embodiments, the first electrode is an anode and the second electrode is a cathode.

In some embodiments, the array substrate comprises a display area and a non-display area, the non-display area surrounds the display area, and the light-emitting layer is in the display area; and the display area comprises a plurality of sub-pixel units, each of the plurality of sub-pixel units defines an open area and a non-open area, the non-open area surrounds the open area, and the auxiliary electrode is in the non-open area.

In some embodiments, the array substrate is a top emitting array substrate, and a transmittance of the second electrode to the light emitted by the light-emitting layer is greater than a transmittance of the first electrode to the light emitted by the light-emitting layer.

In some embodiments, a material of the auxiliary electrode comprises a transparent conductive material.

In some embodiments, a material of the auxiliary electrode comprises an opaque conductive material, and an orthographic projection of the auxiliary electrode on the substrate does not overlap with an orthographic projection of the first electrode on the substrate.

In some embodiments, the array substrate further comprises: an encapsulation cover on a side of the auxiliary electrode away from the substrate; and a transparent conductive electrode between the encapsulation cover and the auxiliary electrode and electrically connected with the auxiliary electrode.

In some embodiments, the array substrate further comprises: a shielding layer between the encapsulation cover and the transparent conductive electrode, the shielding layer defining a plurality of openings, and an orthographic projection of the auxiliary electrode on the substrate falling within an orthographic projection of the shielding layer on the substrate; and a color blocking layer in the plurality of openings defined by the shielding layer, a part of the color blocking layer covering a part of a surface of the shielding layer away from the encapsulation cover.

In some embodiments, the array substrate further comprises: a planarization layer between the transparent conductive electrode and the shielding layer; and a spacer on a side of the planarization layer away from the encapsulation cover and in a groove defined by the transparent conductive electrode, an orthographic projection of the spacer on the substrate falling within the orthographic projection of the auxiliary electrode on the substrate.

In some embodiments, a material of the light-emitting layer comprises an organic material.

In some embodiments, a material of the light-emitting layer comprises an inorganic material, and the inorganic material comprises quantum dots.

According to another aspect of the present disclosure, there is provided a display device comprising the array substrate described in any of the previous embodiments.

According to yet another aspect of the present disclosure, there is provided a method for manufacturing an array substrate, comprising: providing a substrate; forming a first electrode on the substrate; forming a light-emitting layer on a side of the first electrode away from the substrate; forming a second electrode on a side of the light-emitting layer away from the first electrode; and forming an auxiliary electrode on the side of the light-emitting layer away from the first electrode, the auxiliary electrode being electrically connected with the second electrode.

In some embodiments, the step of forming an auxiliary electrode on the side of the light-emitting layer away from the first electrode comprises: forming the auxiliary electrode on a surface of the second electrode away from the light-emitting layer to make the auxiliary electrode be in direct contact with the surface.

In some embodiments, the step of forming an auxiliary electrode on the side of the light-emitting layer away from the first electrode comprises: forming the auxiliary electrode on the side of the light-emitting layer away from the first electrode using a fine metal mask.

In some embodiments, the method further comprises: providing an encapsulation cover; forming a transparent conductive electrode on a side of the encapsulation cover; and assembling and packaging the encapsulation cover on which the transparent conductive electrode is formed and the array substrate on which the auxiliary electrode is formed to electrically connect the transparent conductive electrode with the auxiliary electrode.

In some embodiments, before the step of forming a transparent conductive electrode on a side of the encapsulation cover, the method further comprises: forming a shielding layer on the side of the encapsulation cover, the shielding layer defining a plurality of openings; and forming a color blocking layer in the plurality of openings defined by the shielding layer, a part of the color blocking layer covering a part of a surface of the shielding layer away from the encapsulation cover. After the assembling and packaging, an orthographic projection of the auxiliary electrode on the substrate falls within an orthographic projection of the shielding layer on the substrate.

In some embodiments, after the step of forming a color blocking layer in the plurality of openings defined by the shielding layer, the method further comprises: forming a planarization layer on a surface of the shielding layer and a surface of the color blocking layer away from the encapsulation cover; forming a spacer on a side of the planarization layer away from the encapsulation cover, and forming the transparent conductive electrode on the side of the planarization layer away from the encapsulation cover, wherein the transparent conductive electrode covers at least a surface of the spacer away from the encapsulation cover. After the assembling and packaging, an orthographic projection of the spacer on the substrate falls within the orthographic projection of the auxiliary electrode on the substrate.

BRIEF DESCRIPTION OF THE DRAWINGS

In order to more clearly illustrate the technical solutions in embodiments of the present disclosure, the appended drawings needed to be used in the description of the embodiments will be introduced briefly in the following. Obviously, the drawings described in the following are only some embodiments of the disclosure, and for those of ordinary skill in the art, other drawings may be obtained according to these drawings under the premise of not paying out creative work.

DETAILED DESCRIPTION OF EMBODIMENTS

In the following, the technical solutions in the embodiments of the disclosure will be described clearly and completely in connection with the drawings in the embodiments of the disclosure. Obviously, the described embodiments are only part of the embodiments of the disclosure, and not all of the embodiments. Based on the embodiments in the disclosure, all other embodiments obtained by those of ordinary skill in the art under the premise of not paying out creative work pertain to the protection scope of the disclosure. Those skilled in the art will understand that the following embodiments are intended to explain the present disclosure and should not be regarded as limit to the present disclosure. Unless otherwise specified, if the specific technology or conditions are not clearly described in the following embodiments, those skilled in the art may carry out according to the commonly used technology or conditions in the art or according to the specification of the product.

Figure 1:
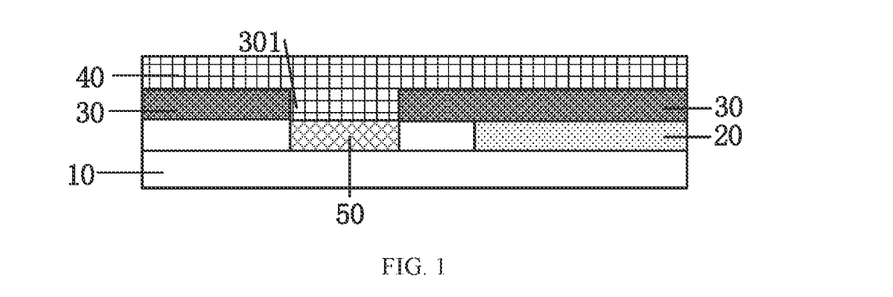
FIG. 1 is a schematic cross-sectional view of a conventional array substrate.

A top emitting display device has the advantages of large aperture ratio and high resolution, so it has been widely paid attention to. The top emitting display device comprises an anode, a cathode and a light-emitting layer sandwiched between the anode and the cathode. In order to reduce the voltage drop on the circuit, it is usually necessary to provide an auxiliary electrode electrically connected with the cathode in the top emitting display device to reduce the impedance of the cathode, so as to reduce the voltage drop on the circuit and reduce power consumption. FIG. 1 shows a schematic cross-sectional view of a conventional array substrate. As shown in the figure, the array substrate includes a substrate 10, an anode 20, a light-emitting layer 30, a cathode 40 and an auxiliary electrode 50. The cathode 40 is electrically connected with the auxiliary electrode 50 through a via 301 in the light-emitting layer 30. The process of fabricating the array substrate is briefly as follows: first, the auxiliary electrode 50 and the anode 20 are formed on the substrate 10, then the light-emitting layer 30 is formed on the anode 20, and the light-emitting layer 30 is perforated with a laser to form the via 301, finally, the cathode 40 is formed on the light-emitting layer 30, and a part of the cathode 40 is filled in the via 301 and electrically connected with the auxiliary electrode 50. With the increase of pixel per inch (PPI) of the array substrate, the tact time for perforation by laser is significantly increased, resulting in a significant reduction in production efficiency; in addition, during the perforating of the light-emitting layer 30 by laser, a large number of particles are formed, and these particles remaining in the array substrate will lead to adverse phenomena such as uneven surface of the subsequently formed film layer, short circuit caused by particles piercing the film layer, black spots or foreign objects on the display screen, etc., which seriously affects the yield of products.

In view of this, the present disclosure provides an array substrate. The array substrate includes a substrate 100, a first electrode 200 on the substrate 100, a light-emitting layer 300 on a side of the first electrode 200 away from the substrate 100, a second electrode 400 on a side of the light-emitting layer 300 away from the first electrode 200, and an auxiliary electrode 500 on the side of the light-emitting layer 300 away from the first electrode 200. The auxiliary electrode 500 is electrically connected with the second electrode 400.

Figure 2:
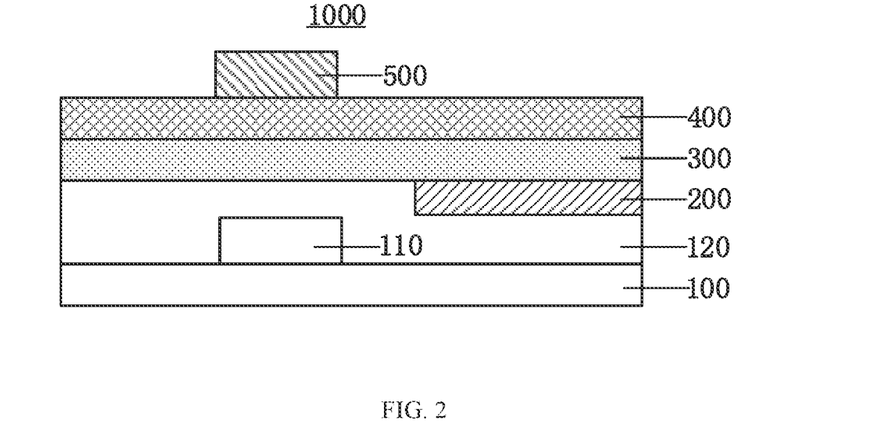
FIG. 2 is a partial schematic cross-sectional view of an array substrate according to an embodiment of the present disclosure.
Figure 3:
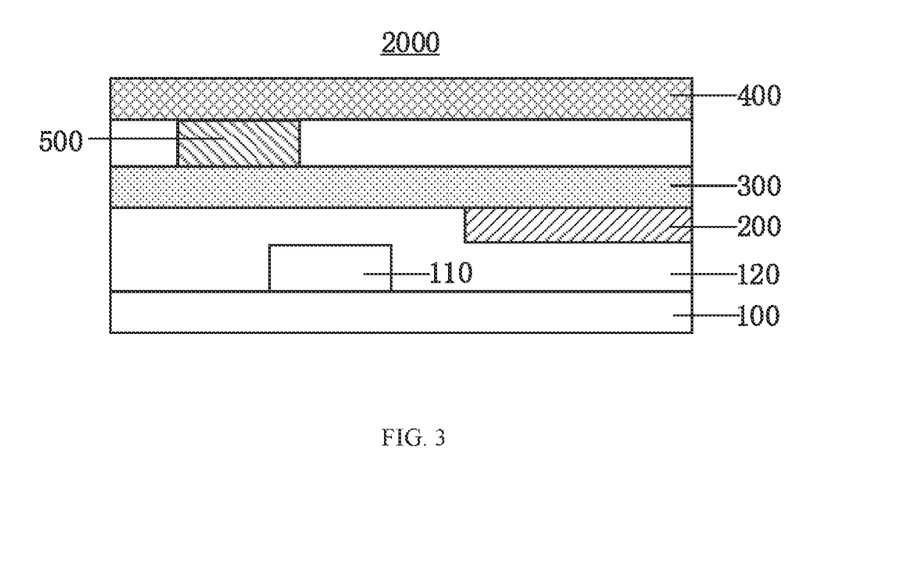
FIG. 3 is a partial schematic cross-sectional view of an array substrate according to an embodiment of the present disclosure.

It should be noted that the phrase "an auxiliary electrode 500 on the side of the light-emitting layer 300 away from the first electrode 200" means that the auxiliary electrode 500 can be on the side of the second electrode 400 away from the light-emitting layer 300, as shown in the array substrate 1000 in FIG. 2, or the auxiliary electrode 500 can be between the second electrode 400 and the light-emitting layer 300, as shown in the array substrate 2000 in FIG. 3. When the auxiliary electrode 500 is on the side of the second electrode 400 away from the light-emitting layer 300, the auxiliary electrode 500 is on and in direct contact with the surface of the second electrode 400 away from the light-emitting layer 300. When the auxiliary electrode 500 is between the second electrode 400 and the light-emitting layer 300, the auxiliary electrode 500 is in direct contact with the surface of the second electrode 400 close to the light-emitting layer 300. With such an arrangement, the electrical connection relationship between the auxiliary electrode 500 and the second electrode 400 can be further simplified, so as to achieve a better electrical connection effect. The array substrate 2000 in FIG. 3 and the array substrate 1000 in FIG. 2 have the same structure except for the position of the auxiliary electrode 500. In the following, the array substrate 1000 will be described in detail as an example.

By disposing the auxiliary electrode 500 on the side of the light-emitting layer 300 away from the first electrode 200 and making the auxiliary electrode 500 to be electrically connected with the second electrode 400, it can not only reduce the impedance of the second electrode 400, so as to reduce the voltage drop and power consumption on the circuit, but also realize the electrical connection between the auxiliary electrode 500 and the second electrode 400 without laser perforation to the light-emitting layer 300. Therefore, the production efficiency can be significantly improved, and a large number of particles formed during the perforating of the light-emitting layer 300 can be avoided, so as to avoid adverse phenomena such as uneven film surface, short circuit caused by particles piercing the film, black spots or foreign objects on the display screen and the like, so as to significantly improve the yield of the product.

It should be noted that the array substrate 1000 can be a forward structure or an inverted structure. In the embodiment in which the array substrate 1000 is a forward structure, the first electrode 200 is an anode, the second electrode 400 is a cathode, and the auxiliary electrode 500 is on the side of the second electrode 400 away from the light-emitting layer 300 and electrically connected with the second electrode 400. In the embodiment in which the array substrate 1000 is an inverted structure, the first electrode 200 is a cathode, the second electrode 400 is an anode, and the auxiliary electrode 500 is on a side of the first electrode 200 away from the light-emitting layer 300 and electrically connected with the first electrode 200. In the following embodiments, as an example, the first electrode 200 is an anode and the second electrode 400 is a cathode.

Figure 4:
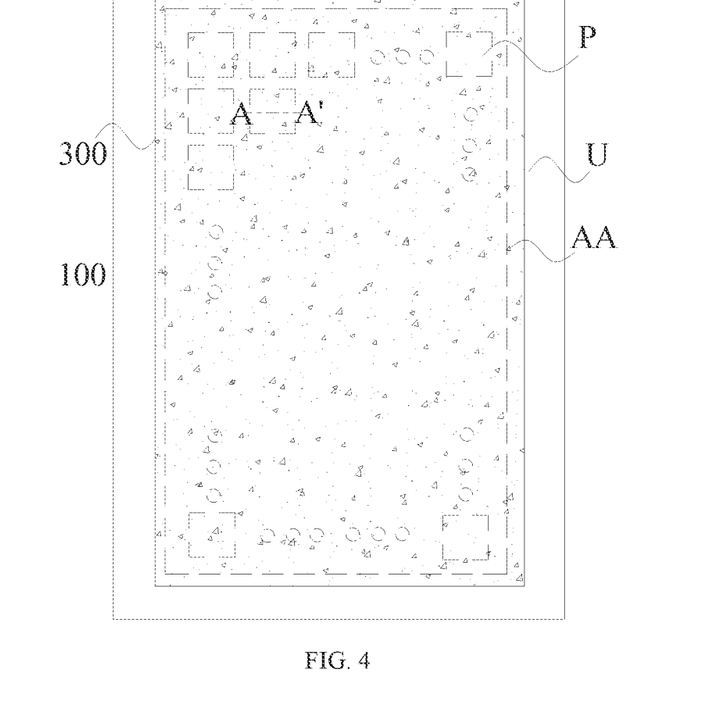
FIG. 4 is a partial top view of an array substrate according to an embodiment of the present disclosure.
Figure 5:
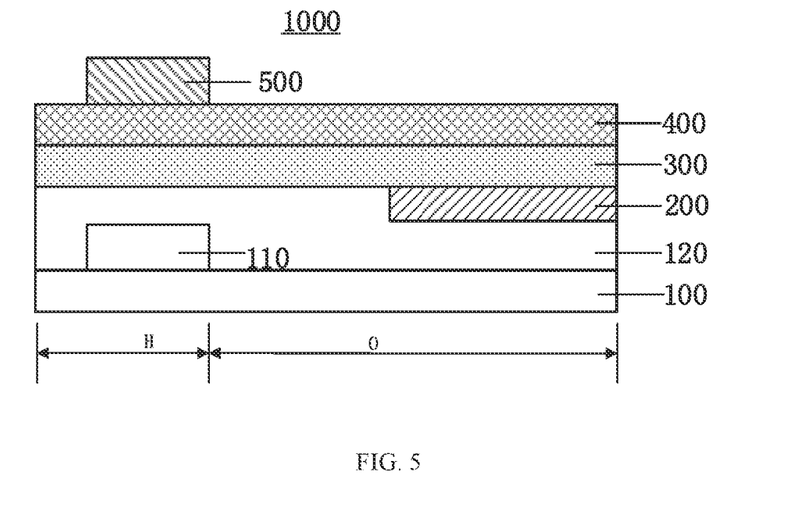
FIG. 5 is a partial schematic cross-sectional view of an array substrate according to an embodiment of the present disclosure.

In some embodiments, referring to FIG. 4, the array substrate 1000 may include a display area AA and a non-display area U, the non-display area U surrounds the display area AA, and an orthographic projection of the light-emitting layer 300 on the substrate 100 falls within the display area AA. The display area AA includes a plurality of sub-pixel units P, and each sub-pixel unit P includes a first electrode 200, a light-emitting layer 300, a second electrode 400, an auxiliary electrode 500, etc. FIG. 5 is a partial cross-sectional view taken along the A-A' line of a sub-pixel unit P in FIG. 4. As shown in the figure, each sub-pixel unit P defines an open area O and a non-open area H, and the non-open area H surrounds the open area O. The auxiliary electrode 500 can be arranged in the non-open area H, so that the auxiliary electrode 500 will not affect the light emission from the open area O while reducing the impedance of the second electrode 400, so as not to affect the aperture ratio of the array substrate 1000.

It should be noted that in the embodiment of the present disclosure, terms such as "open area" refer to an effective light transmission area in each sub-pixel unit P in the array substrate 1000, that is, an area through which the light-emitting layer 300 can emit light; terms such as "non-open area" refer to a non-effective light transmission area in each sub-pixel unit P in the array substrate 1000 (such as the area occupied by some signal lines, transistors, storage capacitors in the sub-pixel unit P), that is, an area through which the light-emitting layer 300 cannot emit light; terms such as "aperture ratio" refer to a ratio of the effective light transmission area in each sub-pixel unit P to the area of the sub-pixel unit P. The higher the aperture ratio is, the higher the efficiency of light transmission is, and therefore the higher the brightness is.

In some embodiments, the array substrate 1000 is a top emitting array substrate, that is, the light emitted by the light-emitting layer 300 is emitted from the side of the second electrode 400 away from the substrate 100. In the top emitting device, the transmittance of the second electrode 400 to the light emitted by the light-emitting layer 300 is greater than the transmittance of the first electrode 200 to the light emitted by the light-emitting layer 300. For example, the second electrode 400 may be formed of a transparent conductive material, including but not limited to transparent oxide such as indium tin oxide (ITO), indium zinc oxide (IZO), etc. The first electrode 200 can be made of reflective materials, including but not limited to any one of aluminum, aluminum doped zinc oxide, silver, gold. By adopting the light-emitting structure of top emitting mode, the aperture ratio of the array substrate 1000 can be higher.

In some embodiments, the material of the auxiliary electrode 500 may be a transparent conductive material, for example, any suitable transparent oxide material such as indium tin oxide (ITO), indium zinc oxide (IZO). In this way, the aperture ratio of the array substrate 1000 can be further improved. In an alternative embodiment, the material of the auxiliary electrode 500 may also be an opaque conductive material, for example conductive metal material such as aluminum, copper, gold, silver and the like, and the orthographic projection of the auxiliary electrode 500 on the substrate 100 may not overlap the orthographic projection of the first electrode 200 on the substrate 100. In this way, the use of opaque conductive metal with smaller resistance can reduce the power consumption of the array substrate 1000.

The light-emitting layer 300 may be any suitable light-emitting layer. The material of the light-emitting layer 300 includes an organic material or an inorganic material. In an example, the light-emitting layer 300 is a light-emitting layer formed of an organic material, thus the array substrate 1000 including the light-emitting layer 300 is an organic light-emitting diode (OLED) array substrate. In an example, the light-emitting layer 300 is a light-emitting layer formed of an inorganic material, and for example, the inorganic material is a material of quantum dots, so that the array substrate 1000 including the light-emitting layer 300 is a quantum dot light-emitting diode (QLED) array substrate. Quantum dots have the advantages of high fluorescence quantum yield, narrow luminescence spectrum, adjustable luminescence spectrum, etc., and have broad application prospects in display and other fields. The material of quantum dots can be any appropriate material, and the embodiment of the present disclosure does not specifically limit the material of quantum dots. For example, the material of quantum dots can be II-VI compounds, perovskite, III-V compounds, I-III-VI compounds, IV-VI compounds, silicon quantum dots, carbon quantum dots, etc.

Continuing to refer to FIG. 5, the array substrate 1000 may further include a thin film transistor (TFT) 110 and an interlayer dielectric layer 120. The thin film transistor 110 is arranged on the substrate 100, a part of the interlayer dielectric layer 120 in the non-open area H is between the thin film transistor 110 and the light-emitting layer 300, and a part of the interlayer dielectric layer 120 in the open area O is between the substrate 100 and the first electrode 200. In this way, the array substrate 1000 can have a more perfect structure and function. It should be noted that, although only one block is used to show the thin film transistor 110 in FIG. 5, this does not mean that only one thin film transistor 110 is included in the sub-pixel unit P, and the number of thin film transistors 110 can be adjusted according to actual design requirements. For example, when the array substrate 1000 is an OLED array substrate, the thin film transistor 110 may include a switching thin film transistor and a driving thin film transistor. After the switching thin film transistor is turned on in response to the signal on the signal line, the driving thin film transistor can be controlled to drive the light-emitting layer 300 to emit light.

Figure 6:
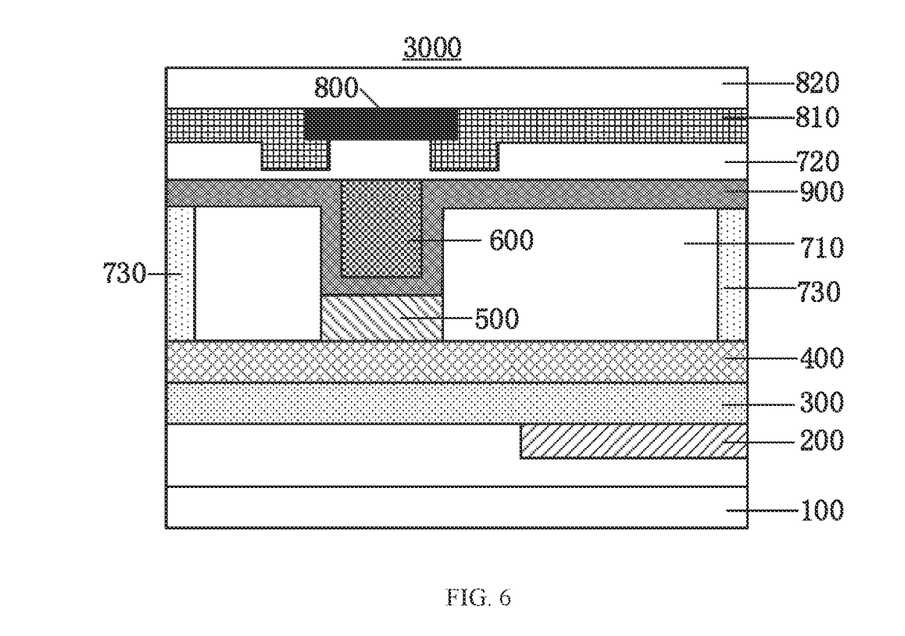
FIG. 6 is a partial schematic cross-sectional view of an array substrate according to an embodiment of the present disclosure.

FIG. 6 shows an array substrate 3000 according to another embodiment of the present disclosure, which may further include an encapsulation cover 820 and a transparent conductive electrode 900 in addition to a substrate 100, a first electrode 200, a light-emitting layer 300, a second electrode 400 and an auxiliary electrode 500. The encapsulation cover 820 is arranged on a side of the auxiliary electrode 500 away from the substrate 100 for encapsulating the array substrate 3000 to protect the array substrate 3000 from damage of external factors such as water vapor, oxygen, impact, so as to improve the reliability and durability of the array substrate 3000. The transparent conductive electrode 900 is arranged between the encapsulation cover 820 and the auxiliary electrode 500 and is electrically connected with the auxiliary electrode 500. In an example, the transparent conductive electrode 900 covers the surface of the spacer 600 away from the encapsulation cover 820 and is in direct contact with the auxiliary electrode 500. In this way, the auxiliary electrodes 500 are connected into a mesh structure, which can better reduce the resistance of the second electrode 400. The material of the transparent conductive electrode 900 may be any suitable transparent conductive oxide material such as ITO and IZO.

Continuing to refer to FIG. 6, the array substrate 3000 may further include a shielding layer 800 and a color blocking layer 810. The shielding layer 800 is between the encapsulation cover 820 and the transparent conductive electrode 900 and defines a plurality of openings, and the orthographic projection of the auxiliary electrode 500 on the substrate 100 falls within the orthographic projection of the shielding layer 800 on the substrate 100. When the auxiliary electrode 500 is composed of an opaque conductive material, the shielding layer 800 can fully cover the auxiliary electrode 500 of the opaque conductive material, so as to improve the display effect of the array substrate 3000. The color blocking layer 810 is arranged in the plurality of openings defined by the shielding layer 800, and a part of the color blocking layer 810 covers a part of the surface of the shielding layer 800 away from the encapsulation cover 820. In some embodiments, the material of the shielding layer 800 is a black matrix (BM) commonly used in the display field. The material of the shielding layer 800 includes one or more of chromium, chromium oxide and black resin. In some embodiments, the color blocking layer 810 may be understood as a color filter, which can accurately select the light wave in a small range of wave bands to pass through and reflect other unwanted wave bands. The color blocking layer 810 includes but is not limited to a red color blocking layer, a green color blocking layer and a blue color blocking layer. The color blocking layers of different colors can correspond to the light-emitting layers emitting different colors. For example, the light-emitting layer emitting red light corresponds to the red color blocking layer, so that the color purity of red light emitted from the array substrate 3000 is higher; the light-emitting layer emitting green light corresponds to the green color blocking layer, so that the color purity of green light emitted from the array substrate 3000 is higher; the light-emitting layer emitting blue light corresponds to the blue color blocking layer, so that the color purity of blue light emitted from the array substrate 3000 is higher.

The array substrate 3000 may further include a planarization layer 720, which covers the surface of the shielding layer 800 and the surface of the color blocking layer 810 away from the encapsulation cover 820. In this way, the planarization layer 720 can flatten the uneven surfaces of the shielding layer 800 and the color blocking layer 810, which is conducive to the continuous fabrication of other structures.

As shown in FIG. 6, the array substrate 3000 may further include a spacer 600 on a side of the planarization layer 720 away from the encapsulation cover 820 and in a groove defined by the transparent conductive electrode 900. The spacer 600 can maintain the distance between the array substrate on which the auxiliary electrode 500 is formed and the encapsulation cover 820, so as to improve the impact resistance of the array substrate 3000. The orthographic projection of the spacer 600 on the substrate 100 may fall within the orthographic projection of the auxiliary electrode 500 on the substrate 100. Thus, the width of a part of the transparent conductive electrode 900 which covers the spacer 600 is consistent with the width of the auxiliary electrode 500, so that the electrical connection effect between the transparent conductive electrode 900 and the auxiliary electrode 500 is better. The spacer 600 may be formed of any suitable material, and the embodiments of the present disclosure do not specifically limit the material of the spacer 600. The shape of the spacer 600 may be any suitable shape, including but not limited to columnar, spherical, etc.

The array substrate 3000 may further include a filling layer 710 and a sealing adhesive 730. The filling layer 710 is filled between the transparent conductive electrode 900 and the second electrode 400, and the sealing adhesive 730 is arranged between the transparent conductive electrode 900 and the second electrode 400 and at both ends of the transparent conductive electrode 900 and the second electrode 400. The materials of the sealing adhesive 730 and the filling layer 710 may be any suitable materials, which are not specifically limited by the embodiment of the present disclosure. The transparent conductive electrode 900 and the second electrode 400 are packaged by the sealing adhesive 730, so that the encapsulation cover 820 is assembled with the array substrate formed with the auxiliary electrode 500. In this way, the array substrate 3000 can be packaged and protected, so that the array substrate 3000 has the function of oxygen isolation and waterproof and hence has a longer service life.

To sum up, according to the embodiments of the present disclosure, an array substrate is proposed. In the array substrate, the auxiliary electrode 500 is arranged on the side of the light-emitting layer 300 away from the first electrode 200 (for example, it is on the side of the second electrode 400 away from the light-emitting layer 300, or, it is between the second electrode 400 and the light-emitting layer 300)

and is electrically connected with the second electrode 400. Through such an arrangement, the step of perforating the light-emitting layer 300 by laser can be omitted in the manufacturing process, so as to effectively solve the problems of long time occupation and too many particles caused by laser perforation, thereby reducing the production cycle of array substrate and improving the yield of products.

Figure 7:
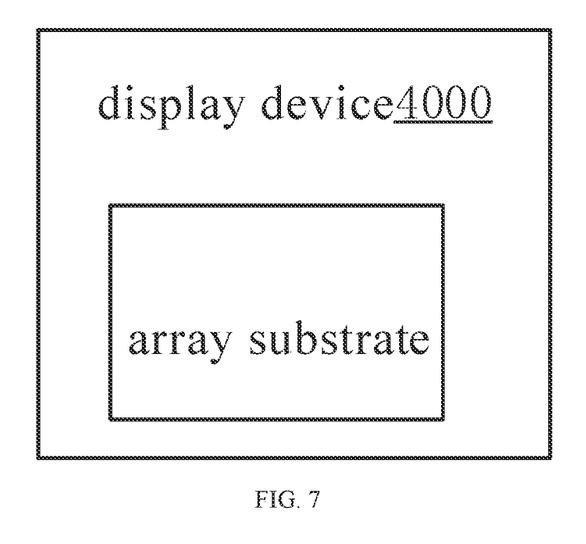
FIG. 7 is a schematic block diagram of a display device according to an embodiment of the present disclosure.

According to another aspect of the present disclosure, a display device is provided. FIG. 7 shows a block diagram of the display device 4000 including the array substrate described in any of the previous embodiments. The display device 4000 can be any suitable device with display function, including but not limited to display panel, TV, digital camera, mobile phone, watch, tablet computer, notebook computer, navigator, etc.

The display device 4000 provided by the embodiment of the present disclosure can have substantially the same technical effect as the array substrate described in the previous embodiments. Therefore, for the purpose of simplicity, the technical effect of the display device 4000 will not be repeated here.

Figure 8:
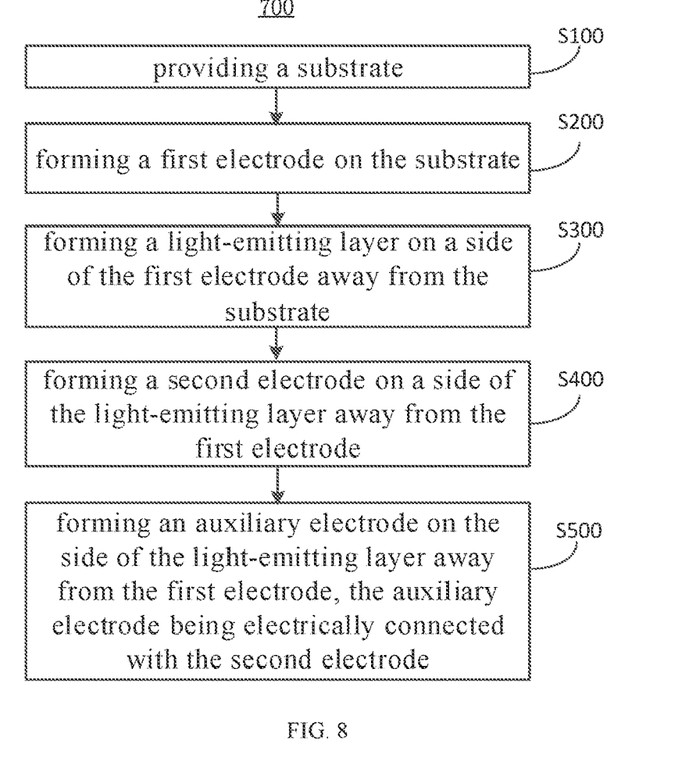
FIG. 8 is a flowchart of a method for manufacturing an array substrate according to an embodiment of the present disclosure.

According to yet another aspect of the present disclosure, there is provided a method for manufacturing an array substrate, which can be applied to the array substrate described in any previous embodiments. The method 700 is described below with reference to FIG. 8 and FIGS. 9A-9D. The method 700 includes the following steps:

S100: providing a substrate.

The substrate 100 may be made of any suitable material, such as a transparent rigid material or a flexible material, including but not limited to materials such as glass, ceramics, silicon, polyimide, etc.

S200: forming a first electrode on the substrate.

Figure 9A:
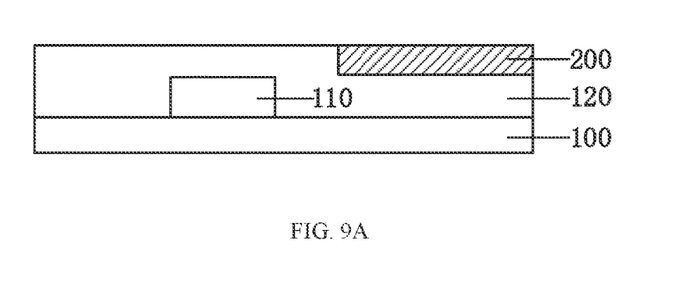
FIGS. 9A-9D are schematic cross-sectional views of the array substrate manufactured according to the method in FIG. 8 at different stages.

Referring to FIG. 9A, a first electrode 200 is formed on the substrate 100. The first electrode 200 may be an anode. The first electrode 200 may be made of a reflective material, including but not limited to any one of aluminum, aluminum doped zinc oxide, silver, gold, etc. In some embodiments of the present disclosure, a thin film transistor 110 and an interlayer dielectric layer 120 may be formed on the substrate 100 first, and then the first electrode 200 may be formed on the interlayer dielectric layer 120.

S300: forming a light-emitting layer on a side of the first electrode away from the substrate.

Figure 9B:
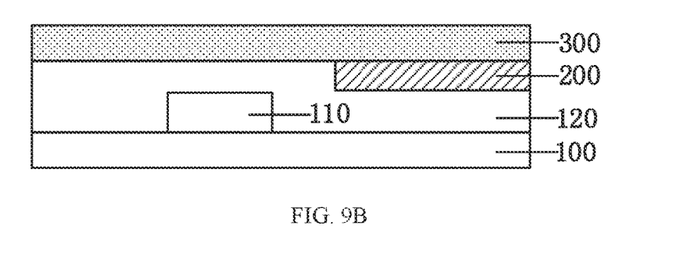

Referring to FIG. 9B, a light-emitting layer 300 is formed on a side of the first electrode 200 away from the substrate 100. The light-emitting layer 300 may be formed of an organic material or an inorganic material (e.g., quantum dots). In an example, the organic material is formed in an area defined by the pixel defining layer by printing or evaporation to form the organic light-emitting layer 300. In another example, the inorganic material (e.g., quantum dots) is formed in an area intended to emit light by spin coating or printing to form the inorganic light-emitting layer 300. In some embodiments of the present disclosure, a display area AA and a non-display area U may be defined on the substrate 100, the non-display area U surrounds the display area AA, and the light-emitting layer 300 is in the display area AA.

S400: forming a second electrode on a side of the light-emitting layer away from the first electrode.

Figure 9C:
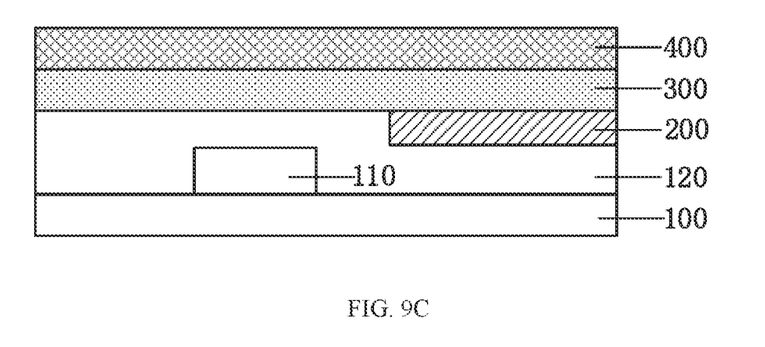

Referring to FIG. 9C, the second electrode 400 is formed on a side of the light-emitting layer 300 away from the first electrode 200. A second electrode film can be formed on the light-emitting layer 300 by evaporation, and then the second electrode film is patterned to form a whole layer of the second electrode 400. The second electrode 400 is a cathode and can be formed of a transparent conductive material, including but not limited to transparent oxide material such as indium tin oxide (ITO), indium zinc oxide (IZO), etc. The transmittance of the second electrode 400 to the light emitted by the light-emitting layer 300 is greater than the transmittance of the first electrode 200 to the light emitted by the light-emitting layer 300, which helps to improve the aperture ratio of the top emitting display device.

S500: forming an auxiliary electrode on the side of the light-emitting layer away from the first electrode, and the auxiliary electrode being electrically connected with the second electrode.

Figure 9D:
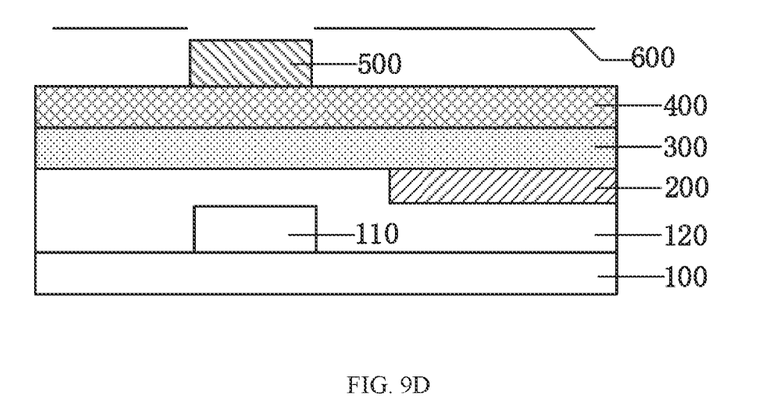

In an example, referring to FIG. 9D, an auxiliary electrode 500 is formed on a side of the second electrode 400 formed in step S400 away from the light-emitting layer 300, and the auxiliary electrode 500 is electrically connected with the second electrode 400. For example, the auxiliary electrode 500 is formed on the surface of the second electrode 400 away from the light-emitting layer 300 so that the auxiliary electrode 500 is in direct contact with the surface. In another example, after step S300, the auxiliary electrode 500 may be formed on a surface of the light-emitting layer 300 away from the first electrode 200, and then the second electrode 400 may be formed on a surface of the auxiliary electrode 500 away from the light-emitting layer 300, so that the auxiliary electrode 500 is electrically connect with the second electrode 400. In this way, by fabricating the auxiliary electrode 500 on the side of the light-emitting layer 300 away from the first electrode 200, the technical problems of increased perforating time and too many particles caused by perforating the light-emitting layer 300 by laser can be avoided, so as to shorten the time for manufacturing the array substrate, and adverse phenomena such as uneven surface of the film layer, short circuit, black spots or foreign objects on the display screen caused by particles can be avoided, which can improve the yield of the product. In some embodiments, the material of the auxiliary electrode 500 may be a transparent conductive material, for example, any suitable transparent oxide material such as indium tin oxide (ITO), indium zinc oxide (IZO). In this way, the aperture ratio of the array substrate can be further improved. In an alternative embodiment, the material of the auxiliary electrode 500 may also be an opaque conductive material, for example conductive metal materials such as aluminum, copper, gold, silver, and the orthographic projection of the auxiliary electrode 500 on the substrate 100 may not overlap the orthographic projection of the first electrode 200 on the substrate 100. In this way, the use of opaque conductive metal with smaller resistance can reduce the power consumption of the array substrate. In some embodiments, as shown in FIG. 9D, the auxiliary electrode 500 can be formed on the side of the light-emitting layer 300 away from the first electrode 200 by using the fine metal mask (FMM) 600. In this way, the pattern of the auxiliary electrode 500 can be made finer, so that the aperture ratio of the array substrate can be made larger.

In some embodiments of the present disclosure, after step S500, the method 700 may further include:

S600: providing an encapsulation cover, and forming a shielding layer and a color blocking layer on a side of the encapsulation cover.

In this step, a shielding layer 800 and a color blocking layer 810 are formed on a side of the encapsulation cover 820, the shielding layer 800 defines a plurality of openings, the color blocking layer 810 is formed in the plurality of openings defined by the shielding layer 800, and a part of the color blocking layer 810 covers a part of the surface of the shielding layer 800 away from the encapsulation cover 820.

In some embodiments, the shielding layer 800 is formed of one or more of chromium, chromium oxide and black resin. In some embodiments, the color blocking layer 810 can be understood as a color filter, which can accurately select the light wave in a small range of wave bands to pass through and reflect other unwanted wave bands. The color blocking layer 810 includes but is not limited to a red color blocking layer, a green color blocking layer and a blue color blocking layer. In this way, the encapsulation cover 820 can realize the function of the color film at the same time, so as to make the display effect of the array substrate better.

S700: forming a planarization layer on a surface of the shielding layer and a surface of the color blocking layer away from the encapsulation cover.

In this step, a planarization layer 720 is formed on the surfaces of the shielding layer 800 and the color blocking layer 810 formed in step S600 away from the encapsulation cover 820. In this way, the surface of the planarization layer 720 away from the encapsulation cover 820 is flat, which is conducive to the subsequent fabrication of other structures.

S800: forming a spacer on a side of the planarization layer away from the encapsulation cover.

In this step, the spacer 600 is formed on a side of the planarization layer 720 formed in step S700 away from the encapsulation cover 820. The spacer 600 can maintain the distance between the array substrate and the encapsulation cover, so as to improve the impact resistance of the array substrate. The spacer 600 may be formed of any suitable material, which is not specifically limited by the embodiments of the present disclosure. The spacer 600 may be of any suitable shape, including but not limited to columnar, spherical, etc.

S900: forming a transparent conductive electrode on a side of the planarization layer away from the encapsulation cover.

In this step, a transparent conductive electrode 900 is formed on a side of the planarization layer 720 away from the encapsulation cover 820, and the transparent conductive electrode 900 covers the surface of the planarization layer 720 away from the encapsulation cover 820 and the surface of the spacer 600 away from the encapsulation cover 820.

S1000: assembling and packaging the encapsulation cover on which the above-mentioned layers are formed and the array substrate on which the auxiliary electrode is formed.

In this step, the encapsulation cover 820 on which the shielding layer 800, the color blocking layer 810, the planarization layer 720, the spacer 600 and the transparent conductive electrode 900 are formed is assembled with the array substrate on which the auxiliary electrode 500 is formed, and the array substrate is encapsulated with the sealing adhesive 730 and the filling layer 710 to realize the function of oxygen isolation and waterproof of the array substrate. After completing the assembling and packaging, the transparent conductive electrode 900 faces the auxiliary electrode 500 and is electrically connected with the auxiliary electrode 500, so that the resistance of the second electrode 400 can be better reduced. The orthographic projection of the auxiliary electrode 500 on the substrate 100 falls within the orthographic projection of the shielding layer 800 on the substrate 100. When the auxiliary electrode 500 is composed of an opaque conductive material, the shielding layer 800 can fully cover the auxiliary electrode 500 of the opaque conductive material, so as to improve the display effect of the array substrate. The orthographic projection of the spacer 600 on the substrate 100 falls within the orthographic projection of the auxiliary electrode 500 on the substrate 100. In this way, the width of a part of the transparent conductive electrode 900 which covers the spacer 600 is consistent with the width of the auxiliary electrode 500, so that the electrical connection effect between the transparent conductive electrode 900 and the auxiliary electrode 500 is better. With this arrangement, the display effect of the array substrate can be better and the power consumption of the array substrate can be lower.

To sum up, according to the embodiments of the present disclosure, a manufacturing method is provided, which can manufacture the auxiliary electrode 500 on the side of the light-emitting layer 300 away from the first electrode 200. In this way, the step of perforating the light-emitting layer 300 by laser can be avoided, so as to effectively solve the problems of longer manufacturing cycle and too many particles caused by laser perforation, thereby improving the production efficiency and yield of the array substrate.

In the description of the present disclosure, the orientation or positional relationship indicated by the terms "up", "down", "left", "right" and the like is based on the orientation or positional relationship shown in the accompanying drawings, which is only for the convenience of describing the present disclosure and does not require that the present disclosure must be constructed and operated in a specific orientation, so it cannot be understood as a limitation of the present disclosure.

In the description of this specification, the description referring to the terms "an embodiment", "another embodiment" and the like means that the specific characteristics, structures, materials or features described in connection with the embodiment are included in at least one embodiment of the present disclosure. In this specification, the schematic expression of the above terms does not have to be for the same embodiments or examples. Further, the specific characteristics, structures, materials or features described may be combined in any one or more embodiments or examples in a suitable manner. In addition, without contradiction, those skilled in the art can combine the different embodiments or examples and the features in different embodiments or examples described in this specification. In addition, it should be noted that in this specification, the terms such as "first" and "second" are only used for descriptive purposes and cannot be understood as indicating or implying relative importance or implicitly indicating the number of indicated technical features.

As will be understood by those skilled in the art, although the steps of the methods in the present disclosure are described in a specific order in the accompanying drawings, this does not require or imply that these steps must be performed in that specific order, unless the context clearly indicates otherwise. Additionally or alternatively, multiple steps can be combined into one step for execution, and/or a step can be decomposed into multiple steps for execution. In addition, other method steps can be inserted between steps. The inserted steps may represent an improvement of the method described herein, or may be independent of the method. In addition, a given step may not be fully completed before the next step begins.

The above is only specific embodiments of the present disclosure, but the scope of protection of the present disclosure is not limited thereto. Any changes or substitutions within the technical scope disclosed by the disclosure that are easily conceived by the ordinary skilled person in the art should be covered within the protection scope of the disclosure. Therefore, the protection scope of the present disclosure should be defined by the protection scope of the claims.

What is claimed is:

1. An array substrate comprising:
a substrate;
a first electrode on the substrate;
a light-emitting layer on a side of the first electrode away from the substrate;
a second electrode on a side of the light-emitting layer away from the first electrode;
an auxiliary electrode on the side of the light-emitting layer away from the first electrode and electrically connected with the second electrode;
an encapsulation covering on a side of the auxiliary electrode away from the substrate;
a transparent conductive electrode between the encapsulation cover and the auxiliary electrode and electrically connected with the auxiliary electrode;
a shielding layer between the encapsulation cover and the transparent conductive electrode, the shielding layer defining a plurality of openings, an orthographic projection of the auxiliary electrode on the substrate falling within an orthographic projection of the shielding layer on the substrate; and
a color blocking layer in the plurality of openings defined by the shielding layer, a part of the color blocking layer covering a part of a surface of the shielding layer away from the encapsulation cover,
wherein the array substrate comprises a display area and a non-display area, the non-display area surrounds the display area, the light-emitting layer is in the display area, the display area comprises a plurality of sub-pixel units, each of the plurality of sub-pixel units defines an open area and a non-open area, the non-open area surrounds the open area, and the auxiliary electrode is in the non-open area, and
wherein an orthographic projection of the auxiliary electrode on the substrate overlaps with an orthographic projection of the light-emitting layer on the substrate, and the light-emitting layer is continuous for the plurality of sub-pixel units and does not comprise any opening.

2. The array substrate according to claim 1, wherein the auxiliary electrode is on a surface of the second electrode away from the light-emitting layer and in direct contact with the surface.

3. The array substrate according to claim 1, wherein the first electrode is an anode and the second electrode is a cathode.

4. The array substrate according to claim 1, wherein the array substrate is a top emitting array substrate, and a transmittance of the second electrode to light emitted by the light-emitting layer is greater than a transmittance of the first electrode to the light emitted by the light-emitting layer.

5. The array substrate according to claim 1, wherein a material of the auxiliary electrode comprises a transparent conductive material.

6. The array substrate according to claim 1, wherein a material of the auxiliary electrode comprises an opaque conductive material, and an orthographic projection of the auxiliary electrode on the substrate does not overlap with an orthographic projection of the first electrode on the substrate.

7. The array substrate according to claim 1, further comprising:
a planarization layer between the transparent conductive electrode and the shielding layer; and
a spacer on a side of the planarization layer away from the encapsulation cover and in a groove defined by the transparent conductive electrode, an orthographic projection of the spacer on the substrate falling within the orthographic projection of the auxiliary electrode on the substrate.

8. The array substrate according to claim 1, wherein a material of the light-emitting layer comprises an organic material.

9. The array substrate according to claim 1, wherein a material of the light-emitting layer comprises an inorganic material, and the inorganic material comprises quantum dots.

10. A display device comprising the array substrate according to claim 1.

11. A method for manufacturing an array substrate, comprising:
providing a substrate;
forming a first electrode on the substrate;
forming a light-emitting layer on a side of the first electrode away from the substrate;
forming a second electrode on a side of the light-emitting layer away from the first electrode; and
forming an auxiliary electrode on a surface of the second electrode away from the light-emitting layer to make the auxiliary electrode be in direct contact with the surface;
providing an encapsulation cover;
forming a shielding layer on the side of the encapsulation cover, the shielding layer defining a plurality of openings;
forming a color blocking layer in the plurality of openings defined by the shielding layer, a part of the color blocking layer covering a part of a surface of the shielding layer away from the encapsulation cover;
forming a transparent conductive electrode on a side of the encapsulation cover; and
assembling and packaging the encapsulation cover on which the transparent conductive electrode is formed and the substrate to electrically connect the transparent conductive electrode with the auxiliary electrode,
wherein after the assembling and packaging, an orthographic projection of the auxiliary electrode on the substrate falls within an orthographic projection of the shielding layer on the substrate,
wherein the array substrate comprises a display area and a non-display area, the non-display area surrounds the display area, the light-emitting layer is in the display area, the display area comprises a plurality of sub-pixel units, each of the plurality of sub-pixel units defines an open area and a non-open area, the non-open area surrounds the open area, and the auxiliary electrode is in the non-open area, and
wherein an orthographic projection of the auxiliary electrode on the substrate overlaps with an orthographic projection of the light-emitting layer on the substrate, and the light-emitting layer is continuous for the plurality of sub-pixel units and does not comprise any opening.

12. The method according to claim 11, after the forming a color blocking layer in the plurality of openings defined by the shielding layer, further comprising:
forming a planarization layer on a surface of the shielding layer and a surface of the color blocking layer away from the encapsulation cover;
forming a spacer on a side of the planarization layer away from the encapsulation cover; and forming the transparent conductive electrode on the side of the planarization layer away from the encapsulation cover, wherein the transparent conductive electrode covers at least a surface of the spacer away from the encapsulation cover, and wherein after the assembling and packaging, an orthographic projection of the spacer on the substrate falls within the orthographic projection of the auxiliary electrode on the substrate.

* * * * *